(12) United States Patent
Vempati et al.

(10) Patent No.: US 9,145,603 B2
(45) Date of Patent: Sep. 29, 2015

(54) METHODS OF ATTACHING A POLYCRYSTALLINE DIAMOND COMPACT TO A SUBSTRATE

(75) Inventors: Chaitanya K. Vempati, Conroe, TX (US); Suresh G. Patel, The Woodlands, TX (US)

(73) Assignee: BAKER HUGHES INCORPORATED, Houston, TX (US)

( * ) Notice: Subject to any disclaimer, the term of this patent is extended or adjusted under 35 U.S.C. 154(b) by 313 days.

(21) Appl. No.: 13/617,604

(22) Filed: Sep. 14, 2012

(65) Prior Publication Data

US 2013/0068539 A1    Mar. 21, 2013

Related U.S. Application Data

(60) Provisional application No. 61/535,618, filed on Sep. 16, 2011.

(51) Int. Cl.
*E21B 10/46* (2006.01)
*C23C 16/04* (2006.01)
*E21B 10/573* (2006.01)
*C23C 16/27* (2006.01)
(Continued)

(52) U.S. Cl.
CPC .............. *C23C 16/045* (2013.01); *C23C 16/042* (2013.01); *C23C 16/27* (2013.01); *C23C 16/32* (2013.01); *C23C 16/342* (2013.01); *C23C 16/50* (2013.01); *C23C 16/56* (2013.01); *E21B 10/5735* (2013.01); *C22C 2204/00* (2013.01)

(58) Field of Classification Search
CPC ............................ E21B 10/46; E21B 10/5735
USPC ...................... 175/434, 425, 426, 435; 51/309
See application file for complete search history.

(56) References Cited

U.S. PATENT DOCUMENTS 4,764,434 A * 8/1988 Aronsson et al. .............. 428/565
5,833,021 A   11/1998 Mensa-Wilmot et al.
(Continued)

FOREIGN PATENT DOCUMENTS

WO       2008099220 A2   8/2008
WO     WO2009018427 A1   2/2009
WO     WO2010083351 A2   7/2010

OTHER PUBLICATIONS

International Search Report for International Application No. PCT/US2012/055465 now WO201304381 dated Feb. 20, 2013, 3 pages.
(Continued)

*Primary Examiner* — Kenneth L Thompson
(74) *Attorney, Agent, or Firm* — TraskBritt

(57) ABSTRACT

Methods of attaching a polycrystalline diamond compact (PDC) element to a substrate include maintaining a gap between the PDC element and an adjacent substrate, and at least substantially filling the gap with a deposition process. Methods of forming a cutting element for an earth-boring tool include forming a PDC element by pressing diamond crystals together, forming a substrate including a particulate carbide material and a matrix material, leaving a gap between at least portions of the PDC element and the substrate, masking surfaces of the PDC element and of the substrate that do not face the gap, and forming an adhesion material on surfaces of the PDC element and of the substrate that face the gap. Cutting elements for earth-boring tools include a PDC element attached to a substrate with at least one of diamond, diamond-like carbon, a carbide material, a nitride material, and a cubic boron nitride material.

20 Claims, 7 Drawing Sheets

(51) Int. Cl.
 *C23C 16/32* (2006.01)
 *C23C 16/34* (2006.01)
 *C23C 16/50* (2006.01)
 *C23C 16/56* (2006.01)

(56) References Cited

U.S. PATENT DOCUMENTS

| | | | |
|---|---|---|---|
| 6,344,149 B1* | 2/2002 | Oles | 216/11 |
| 6,800,383 B1 | 10/2004 | Lakhotkin et al. | |
| 7,108,598 B1* | 9/2006 | Galloway | 451/542 |
| 7,267,187 B2 | 9/2007 | Kembaiyan | |
| 7,776,256 B2 | 8/2010 | Smith et al. | |
| 7,802,495 B2 | 9/2010 | Oxford et al. | |
| 8,821,603 B2* | 9/2014 | Bitler et al. | 51/293 |
| 2005/0087371 A1 | 4/2005 | Kembaiyan | |
| 2008/0202821 A1 | 8/2008 | McClain et al. | |
| 2008/0223621 A1* | 9/2008 | Middlemiss et al. | 175/428 |
| 2009/0313908 A1 | 12/2009 | Zhang et al. | |
| 2010/0031799 A1 | 2/2010 | Ast et al. | |
| 2010/0084197 A1 | 4/2010 | Voronin et al. | |
| 2010/0108403 A1 | 5/2010 | Keshavan | |
| 2011/0000715 A1 | 1/2011 | Lyons et al. | |
| 2011/0031034 A1 | 2/2011 | DiGiovanni et al. | |
| 2011/0266059 A1* | 11/2011 | Digiovanni et al. | 175/57 |

OTHER PUBLICATIONS

International Written Opinion for International Application No. PCT/US2012/055465 now WO201304381 dated Feb. 20, 2013, 5 pages.
International Preliminary Report on Patentability for International Application No. PCT/US2012/055465 now WO201304381 dated Mar. 18, 2014, 6 pages.

* cited by examiner

METHODS OF ATTACHING A POLYCRYSTALLINE DIAMOND COMPACT TO A SUBSTRATE

CROSS-REFERENCE TO RELATED APPLICATION

This application claims the benefit of U.S. Provisional Patent Application Ser. No. 61/535,618, filed Sep. 16, 2011, the disclosure of which is hereby incorporated herein in its entirety by this reference.

TECHNICAL FIELD

Embodiments of the present disclosure relate generally to methods of attaching a polycrystalline diamond compact ("PDC") to a substrate. Embodiments relate to methods of attaching a PDC to a substrate including depositing material between the PDC and the substrate by a deposition process. Embodiments of the disclosure relate to cutting elements formed using such methods. Embodiments of the disclosure also relate to earth-boring tools formed using such methods.

BACKGROUND

Earth-boring tools for forming wellbores in subterranean earth formations generally include a plurality of cutting elements secured to a body. For example, fixed-cutter earth-boring rotary drill bits (also referred to as "drag bits") include a plurality of cutting elements that are fixedly attached to a bit body of the drill bit. Similarly, roller cone earth-boring rotary drill bits may include cones that are mounted on bearing pins extending from legs of a bit body such that each cone is capable of rotating about the bearing pin on which it is mounted. A plurality of cutting elements may be mounted to each cone of the drill bit.

The cutting elements used in such earth-boring tools often include polycrystalline diamond compact (often referred to as "PDC") cutting elements, which are cutting elements that include cutting faces of a polycrystalline diamond material. Polycrystalline diamond material is material that includes inter-bonded grains or crystals of diamond material. In other words, polycrystalline diamond material includes direct, inter-granular bonds between the grains or crystals of diamond material. The terms "grain" and "crystal" are used synonymously and interchangeably herein.

Polycrystalline diamond compact cutting elements are formed by sintering and bonding together relatively small diamond grains under conditions of high temperature and high pressure in the presence of a metal solvent catalyst (such as, for example, cobalt, iron, nickel, or alloys and mixtures thereof) to form a layer or "table" of polycrystalline diamond material on a cutting element substrate. These processes are often referred to as "high temperature/high pressure" (or "HTHP") processes. The cutting element substrate may comprise a cement material (i.e., a ceramic-metal composite material) such as, for example, cobalt-cemented tungsten carbide. In such instances, the cobalt (or other catalyst material) in the cutting element substrate may be swept into the diamond grains during sintering and serve as a catalyst material for forming the inter-granular diamond-to-diamond bonds between, and the resulting diamond table from, the diamond grains. In other methods, powdered catalyst material may be mixed with the diamond grains prior to sintering the grains together in an HTHP process.

Upon formation of a diamond table using an HTHP process, catalyst material may remain in interstitial spaces between the grains of diamond in the resulting polycrystalline diamond table.

Differences in the thermal expansion between the diamond table and the cutting element substrate to which it is bonded may result in relatively large compressive and/or tensile stresses at an interface between the diamond table and the substrate that eventually lead to deterioration of the diamond table, cause the diamond table to delaminate from the substrate, or result in general ineffectiveness of the cutting element.

There are several conventional ways of making a PDC cutting element. For example, as shown in FIG. 1, a single HTHP cycle (e.g., in a diamond press 25) may be used to press diamond feed 10 (e.g., polycrystalline diamond grit bound together in a matrix) and a carbide substrate 20 together. The HTHP cycle simultaneously binds the material of the PDC feed 10 together to form a PDC table 30 and binds the PDC table 30 to the carbide substrate 20 to form a PDC cutting element 40. In another example, shown in FIG. 2, diamond feed 10 may be pressed in an HTHP cycle (e.g., in a diamond press 25) to form a preformed PDC table 50. The preformed PDC table 50 may then be attached to a carbide substrate 20 in another HTHP cycle (e.g., in a diamond press 25) to form a PDC cutting element 60. In either of the first two examples (FIGS. 1 and 2), the PDC table 30, 50 may include a cobalt (or other metal) catalyst and the carbide substrate 20 may include cobalt (or other metal) in a matrix phase. Thus, the PDC table 30, 50 and the carbide substrate 20 may be bound together by cobalt (or other metal) at the interface between the PDC table 30, 50 and the carbide substrate. In yet another example, shown in FIG. 3, a preformed PDC table 50 may be formed by pressing diamond feed 10 in an HTHP cycle (e.g., in a diamond press 25). The preformed PDC table 50 may be attached to a carbide substrate 20 by high temperature brazing to form a brazed PDC cutting element 70. The PDC table 50 and the carbide substrate 20 may be bound together by a braze alloy.

Conventional methods of attaching a PDC to a substrate, such as those described with reference to FIGS. 1-3, may have certain disadvantages. For example, stress may be induced at an interface between the PDC and the substrate during the pressing cycle. Stress may also be induced at the interface due to the high temperature of a brazing process. The level of stress at the interface that is ideal for stress propagation when the PDC cutting element is used (e.g., in boring the earth) may not be ideal for reducing the stress state after the pressing or brazing cycles.

Conventionally, PDC cutting elements including a PDC table and a carbide substrate are formed as described and then attached to the surface of a bit body of an earth-boring tool. The PDC cutting elements may be attached to the bit body using a brazing process. The brazing process can cause thermal stress or degradation of materials at the interface between the PDC cutting elements and the bit body.

BRIEF SUMMARY

In some embodiments, the present disclosure includes methods of attaching a polycrystalline diamond compact (PDC) element to a substrate. In accordance with such methods, a PDC element is positioned adjacent to a substrate and a gap is maintained between the PDC element and the substrate. The gap is at least substantially filled with an adhesion material using at least one of a chemical vapor deposition process, a plasma deposition process, a plasma-enhanced chemical vapor deposition process, a plasma arc deposition process, and a physical vapor deposition process.

In some embodiments, the present disclosure includes methods of forming a cutting element for an earth-boring tool. In accordance with such methods, a PDC element is formed by pressing diamond crystals together and a substrate is formed, the substrate comprising a particulate carbide material and a matrix material. The PDC element is positioned adjacent the substrate leaving a gap between at least portions of the PDC element and the substrate. Surfaces of the PDC element and of the substrate that do not face the gap are masked. An adhesion material is framed on surfaces of the PDC element and of the substrate that face the gap to at least substantially fill the gap with the adhesion material.

In some embodiments, the present disclosure includes cutting elements for an earth-boring tool. The cutting elements include a PDC element attached to a substrate with an adhesion material, the adhesion material formed by a deposition process and comprising at least one of diamond, diamond-like carbon, a carbide material, a nitride material, and a cubic boron nitride material.

DETAILED DESCRIPTION

The illustrations presented herein are not meant to be actual views of any particular material, apparatus, system, or method, but are merely idealized representations which are employed to describe certain embodiments of the present invention.

As used herein, the term "substantially" includes to a degree that one skilled in the art would understand the given parameter, property, or condition is met with a small degree of variance, such as within acceptable manufacturing tolerances.

Figure 1:
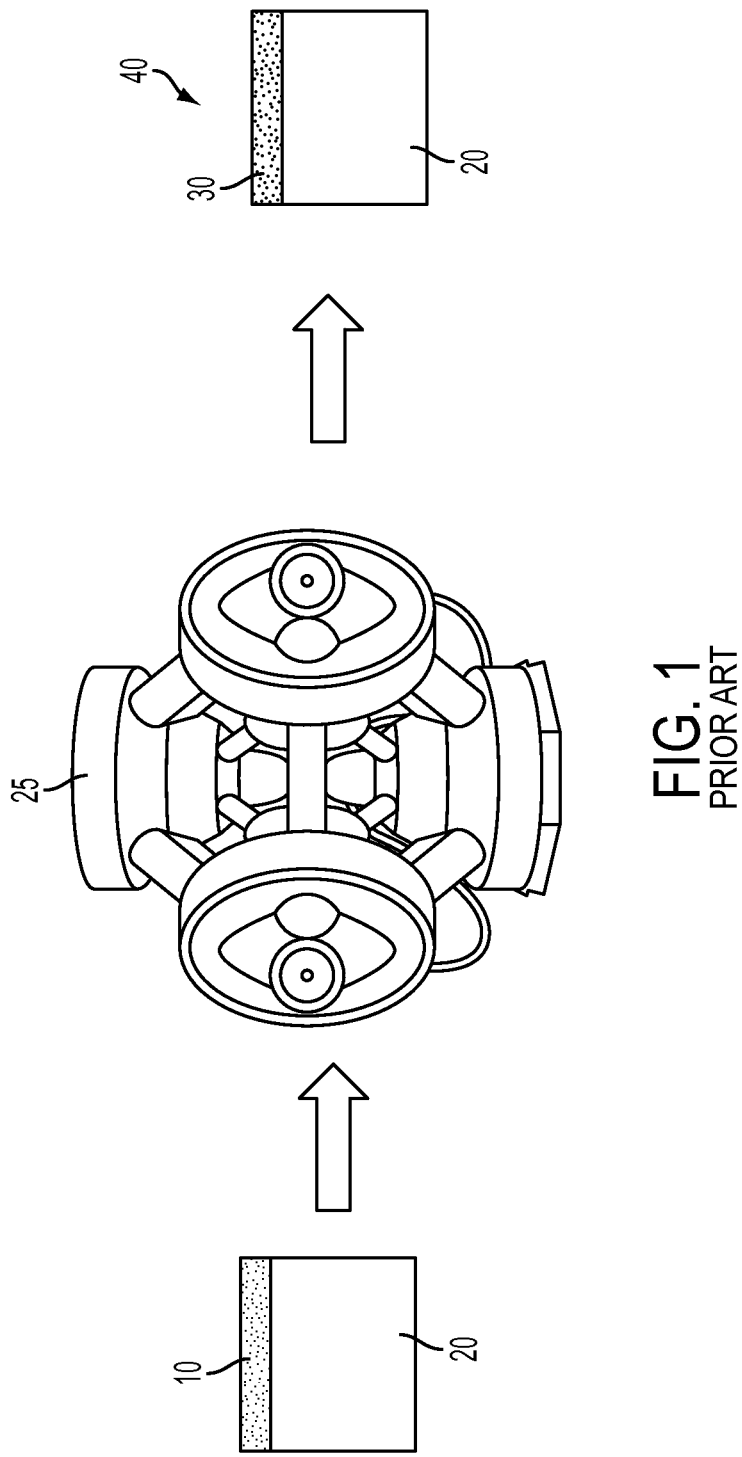
FIG. 1 illustrates a known method for forming a polycrystalline diamond compact ("PDC") cutting element.
Figure 2:
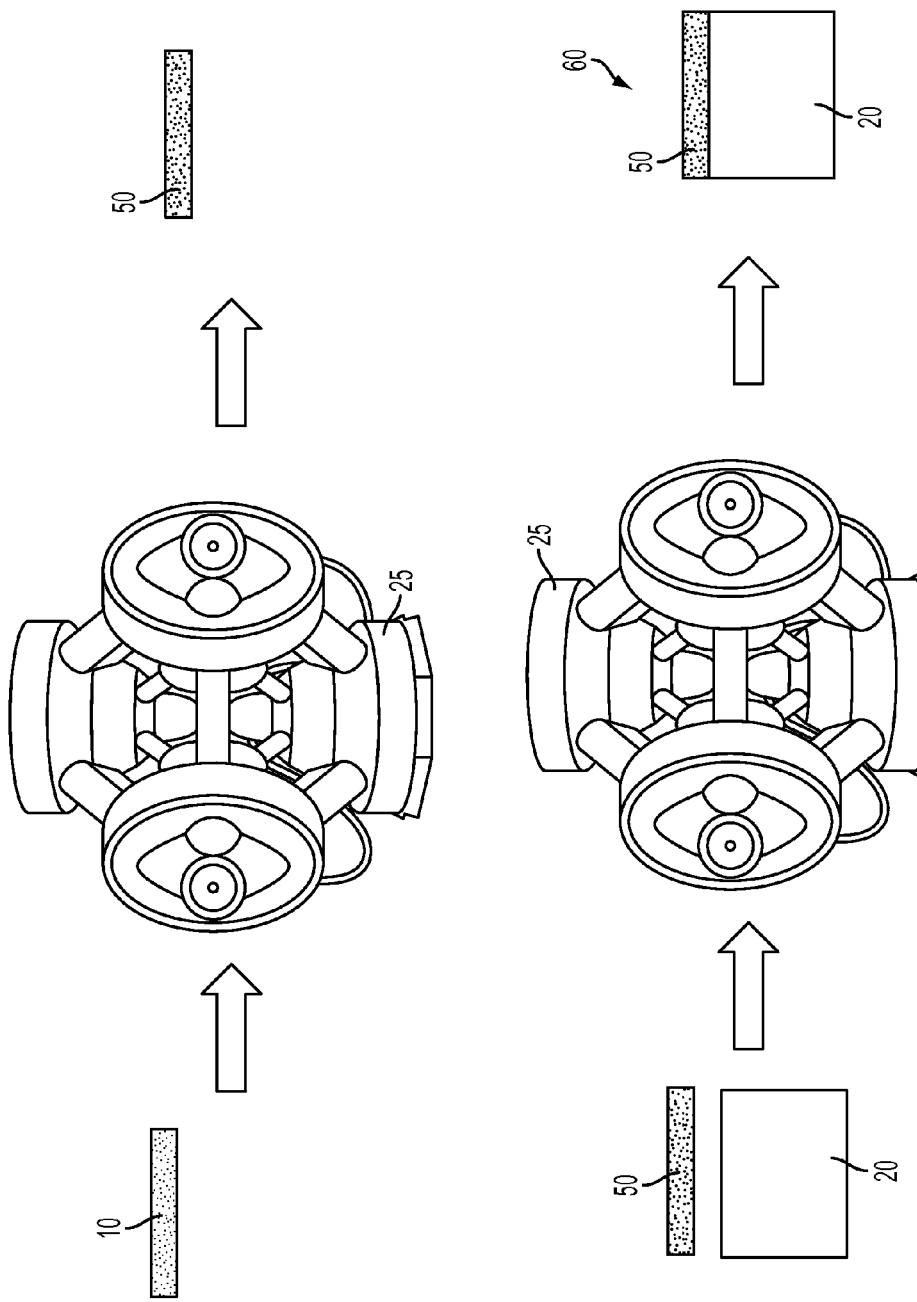
FIG. 2 illustrates another known method for forming a PDC cutting element.
Figure 3:
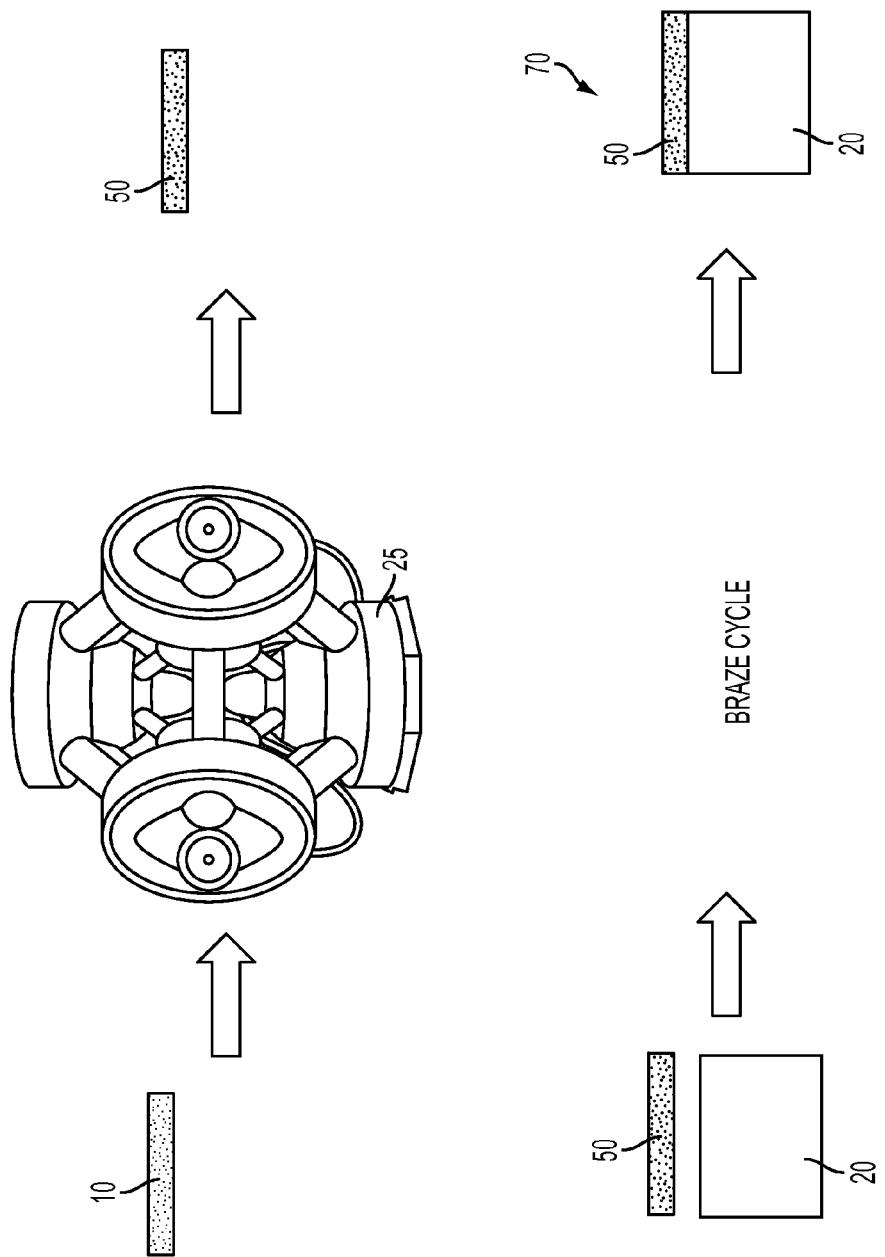
FIG. 3 illustrates yet another known method for forming a PDC cutting element.
Figure 4C:
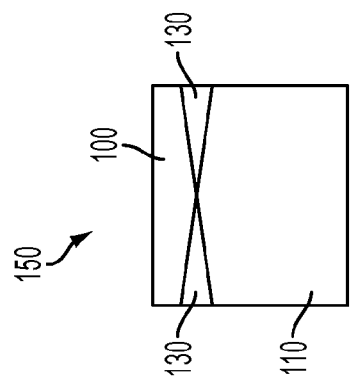
FIGS. 4A-4C illustrate an embodiment of a method of the present disclosure for forming a PDC cutting element.
Figure 4B:
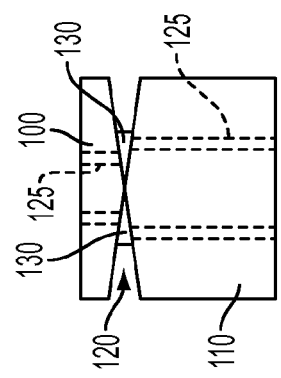
Figure 4A:
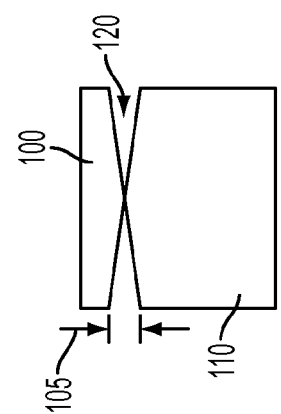

A method of attaching a polycrystalline diamond compact ("PDC") element to a substrate is shown by way of example in FIGS. 4A-4C. Such a method may be useful in forming PDC cutting elements including PDC cutting elements for earth-boring tools.

As illustrated in FIGS. 4A-4C, embodiments of the present disclosure include methods of forming a PDC cutting element 150 that includes a PDC element 100 and a substrate 110 held together by an adhesive material 130. The PDC element 100 may be attached to the substrate 110 by positioning the PDC element 100 and the substrate 110 a distance 105 apart from one another to form a gap 120 therebetween, and by filling the gap 120 with the adhesive material 130 using a deposition process, as explained below. As shown in FIG. 4A, opposing surfaces of the PDC element 100 and of the substrate 110 may face the gap 120. The gap 120 may be defined by a substantially uniform or a variable distance 105 between the PDC element 100 and the substrate 110, depending on the shape of the opposing surfaces. The gap 120 may be maintained by one or more standoff structures positioned between the PDC element 100 and the substrate 110, although other methods of maintaining the gap 120 may be used. In some embodiments, a point or portion of the PDC element 100 may contact a point or portion of the substrate 110, as shown in FIG. 4A.

The distance 105 between the PDC element 100 and the substrate 110 may be a relatively small distance to allow a subsequent deposition process to substantially fill the gap 120 with an adhesion material 130, as will be described in more detail below with reference to FIGS. 4B and 4C. As noted above, the distance 105 may be substantially uniform or may vary across opposing surfaces of the PDC element 100 and the substrate 110 facing the gap 120. By way of example and not limitation, a maximum distance 105 may be between about 1 μm and about 160 μm. In some embodiments, the maximum distance 105 may be between about 60 μm and about 80 μm. In other embodiments, the maximum distance 105 may be between about 120 μm and about 160 μm. Some processes used to form an adhesion material 130 may form a thin film of the adhesion material 130 on a surface of the substrate 110 and on a surface of the PDC element 100. Such a thin film formed on a single substrate surface may have a thickness of up to about 80 μm. Therefore, in such embodiments, the maximum distance 105 may be less than about 160 μm (i.e., twice the thickness to which the thin film may be deposited on each of the surface of the substrate 110 and the surface of the PDC element 100 facing the gap 120) to enable such thin films of the adhesion material 130 to substantially fill the gap 120. However, other processes may be capable of filling a larger gap. Accordingly, the present disclosure includes embodiments in which the gap 120 is defined by a distance 105 that is larger than the values listed above. The distance 105 may be held constant during the formation of the adhesion material 130. For example, standoffs may be used to hold the PDC element 100 adjacent to the substrate 110 and the desired distance 105 apart.

In an embodiment in which the distance 105 varies across the surfaces of the PDC element 100 and the substrate 110 facing the gap 120, the distance 105 in a central region of the gap 120 may be smaller than the distance 105 in an outer region of the gap 120. This variable distance 105 may be accomplished by forming the PDC element 100 and/or the substrate 110 to have a tapered (e.g., conical, frustoconical, curved, etc.) surface facing the gap 120. In other words, one or more of the PDC element 100 and the substrate 110 may have a greater thickness in a central region thereof compared to a thickness in an outer region thereof. Thus, the gap 120 may be defined by a greater distance 105 in an outer region thereof and by a lesser distance 105 in a central region thereof. In some embodiments, a surface or point in the central region of the PDC element 100 may touch the underlying substrate 110, essentially dropping the distance 105 to zero in the central region. The variable distance 105 may enable the adhesion material 130 (FIGS. 4B and 4C) to fill the gap 120 starting proximate the central region of the gap 120 and continuing outwards to the outer region of the gap 120 as the material is deposited, thus avoiding or reducing the formation of voids in the adhesion material 130. For example, the film of adhesion material 130 formed in the gap 120 and on the surfaces of the PDC element 100 and of the substrate 110 may be formed (e.g., deposited, grown, etc.) on the surfaces at a generally uniform rate. However, since the central region of the gap 120 may be narrower than the outer region, the films on each of the surfaces of the PDC element 100 and the substrate 110 facing the gap 120 may grow into and contact each other starting at the central region and progressing to the outer region, effectively filling the gap 120 progressively from the central region to the outer region of the gap 120. In this manner, the adhesion material 130 may substantially fill the entire gap 120 with reduced or substantially no voids, to provide a bond across the interface between the PDC element 100 and the substrate 110.

Although FIGS. 4A-4C show the PDC element 100 and the substrate 110 both having tapered surfaces facing the gap 120, the present disclosure is not so limited. For example, one of the PDC element 100 and the substrate 110 may have a substantially planar surface facing the gap 120. In one embodiment, each of the PDC element 100 and the substrate 110 may have a substantially planar surface facing the gap 120.

It is noted that the gap 120, the distance 105, and the slope of the tapering of the surface of the PDC element 100 and of the surface of the substrate 110 facing the gap 120 are exaggerated for clarity and convenience in FIGS. 4A-4C, as well as in FIGS. 5, 6, 8, and 9, which are described in more detail below. In reality, the gap 120 may be smaller, the distance 105 may be less, and the slope of the tapering may be lower than is shown in the views of FIGS. 4A-6, 8, and 9.

The PDC element 100 may be a PDC table formed by known methods, such as by a high temperature/high pressure ("HTHP") method using a diamond press to form direct diamond-to-diamond inter-granular bonds between diamond crystals. In some embodiments, the PDC element 100 may be formed using a plurality of diamond crystals and a catalyst material to encourage diamond-to-diamond bonding. The catalyst material may be, for example, silicon, cobalt, iron, nickel, or alloys and mixtures thereof. In one embodiment, the catalyst material may be silicon. In some embodiments, the catalyst material used in the formation of the PDC element 100 may remain in interstitial spaces between diamond grains of the final PDC element 100 used to form the PDC cutting element 150. In other embodiments, at least a portion of the catalyst material may be removed (e.g., leached) from the PDC element 100 prior to or after attaching the PDC element 100 to the substrate 110. For example, catalyst material may be removed from interstitial spaces between diamond grains of the PDC element 100 in an outer portion thereof (e.g., within about 100 µm from an outer surface of the PDC element 100), such as by dissolving the catalyst material in an acid solution for a controlled period of time. By way of another example and not limitation, a larger portion (e.g., greater than about 100 µm from an outer surface of the PDC element 100) of the catalyst material may be removed from interstitial spaces between diamond grains of the PDC element 100, such as by dissolving the catalyst material in an acid solution for a longer period of time, while a smaller portion of the catalyst material may remain in the PDC element 100 compared to thin leaching. In some embodiments, at least substantially all of the catalyst material may be removed from the PDC element 100. PDC elements with some or all of the catalyst material removed may be referred to in the art as thermally stable polycrystalline (TSP) diamond elements due to their resistance to thermal and mechanical degradation at relatively higher temperatures compared to PDC elements with catalyst material remaining in interstitial spaces between diamond grains throughout the PDC elements.

The substrate 110 may include, by way of non-limiting example, a carbide material. For example, the substrate 110 may be formed of a ceramic-metallic composite material (i.e., a so-called "cement" material), which may include a plurality of ceramic hard phase particles (e.g., a particulate carbide material) bound together in a metal matrix material. For example, the substrate 110 may comprise cobalt-cemented tungsten carbide. In addition or alternatively, the substrate 110 may be formed of another material with relatively higher toughness to support the PDC element 100 attached thereto during drilling of a formation. The substrate 110 may be formed by known methods separately from the PDC element 100, such as by pressing and sintering granular ceramic material and matrix material, or by infiltrating a particulate ceramic material with a molten matrix material, for example. The substrate 110 may be a cemented carbide substrate.

Although the PDC cutting element 150 and the corresponding PDC element 100 and substrate 110 are shown as having a generally cylindrical shape, the present disclosure may also apply to cutting elements of other known or unknown shapes. For example, the cutting element 150 may be dome-tipped, chisel-shaped, tombstone-shaped, etc.

As shown in FIGS. 4B and 4C, the adhesion material 130 may be provided in the gap 120 between the PDC element 100 and the substrate 110. Some example adhesion materials 130 that may be used in the methods of the present disclosure may be a relatively hard material, such as one or more of diamond (e.g., polycrystalline or monocrystalline diamond), diamond-like carbon ("DLC"), a carbide material (e.g., metal carbide, silicon carbide, etc.), a nitride material (e.g., titanium nitride), and a cubic boron nitride ("CBN") material. In some embodiments, the adhesion material 130 may be a catalyst material selected to catalyze formation of inter-granular bonds in diamond material, such as cobalt, iron, nickel, silicon, or alloys and mixtures thereof. The adhesion material 130 may be formed (e.g., deposited, grown) on the surface of the PDC element 100 and on the surface of the substrate 110 facing the gap 120. In some embodiments, the adhesion material 130 may fill the gap beginning in a central region of the gap 120 and proceed outward to substantially fill the entire gap 120. By way of example, the initial formation of the adhesion material 130 in a central region of the gap 120 may be accomplished by forming one or more of the surfaces of the PDC element 100 and of the substrate 110 to have a non-planar configuration, as described above. In addition or as an alternative, one or more of the surfaces of the PDC element 100 and of the substrate 110 may be roughened or textured in an effort to improve the strength of the bond.

The gap 120 between the PDC element 100 and the substrate 110 may be filled with the adhesion material 130 using a deposition process. In other words, a deposition process may be used to deposit the adhesion material 130 in the gap 120. The deposition process may comprise, for example, at least one of a chemical vapor deposition (CVD) process, a plasma deposition process, and a physical vapor deposition (PVD) process. In some embodiments, the deposition process may comprise a plasma-enhanced chemical vapor deposition ("PECVD") process. Plasma arc deposition processes may also be employed. The deposition process may be performed at reduced pressure, ambient pressure, or elevated pressure, depending on the technique used and the material to be deposited. The particular technique used to form the adhesion material 130 may be a function of the material used for the adhesion material 130. For example, if the adhesion material 130 is to comprise a carbide (e.g., tungsten carbide) material, a PECVD process using a plasma formed of ions from the carbide material (e.g., tungsten ions and carbon ions) may be used to deposit the carbide material in the gap 120. By way of another non-limiting example, a CVD process using a carbon (e.g., hydrocarbon) precursor may be used to deposit a diamond or diamond-like material in the gap 120.

In some embodiments, the deposition process may be carried out at relatively low temperatures. For example, the deposition process may be carried out at temperatures below about 600° C., below about 400° C., below about 200° C., or even below about 150° C.

To form the adhesion material 130 in the gap 120, a plasma deposition process may be used. By way of example, a plasma-enhanced chemical vapor deposition ("PECVD") process may be performed on the PDC element 100 and the substrate 110 while they are held adjacent one another to form the gap 120. The PECVD process may be performed on the PDC element 100 and the substrate 110 while disposed within a PECVD chamber, as is known in the art. Formation of the adhesion material 130 may be accomplished by a low temperature PECVD process. For example, the adhesion material 130 may be formed with a process operating at less than about 600° C. In some embodiments, the adhesion material 130 may be formed with a process operating at less than about 150° C. In one embodiment, the adhesion material 130 may be formed with a process operating at between about 100° C. and about 110° C. The operating temperature of the process used to form the adhesion material 130 may be less than the temperatures used in a conventional HTHP process (i.e., above about 1200° C.). The operating temperature of the process used to form the adhesion material 130 may also be less than the temperatures used to conventionally braze a PDC and a substrate together (e.g., above about 800° C.). Thus, at least some of the disadvantages of a conventional HTHP process or a conventional brazing process associated with subjecting components of a PDC cutting element to relatively high temperatures may be reduced or avoided by using methods of the present disclosure.

As noted above, in some embodiments, a plasma deposition (e.g., PECVD) process may be used to deposit the adhesion material 130 in the gap 120. For example, HARDIDE® is a tungsten carbide material that may be used as the adhesion material 130 formed by a plasma deposition process. The HARDIDE® may be a tungsten carbide material that is vapor deposited at a temperature between about 500° C. and about 600° C. By way of example, methods used to form a HARDIDE® material are disclosed in U.S. patent application Ser. No. 09/913,324, filed Feb. 11, 1999, now U.S. Pat. No. 6,800,383, titled "TUNGSTEN CARBIDE COATING AND METHOD FOR PRODUCING THE SAME," the disclosure of which is hereby incorporated by reference herein in its entirety. By way of another example, ADAMANT® diamond coating is diamond or diamond-like material that may be used as the adhesion material 130 formed by CVD using a carbon precursor and a hydrogen gas mixture. Another method of forming a diamond-like material that may be used as the adhesion material 130 is disclosed in PCT Publication No. WO 2008/099220, filed Feb. 15, 2008, and titled "Methods and Apparatus for Forming Diamond-like Coatings," the disclosure of which is incorporated herein in its entirety by this reference. Briefly, the PCT publication discloses a method in which a hydrocarbon gas precursor may be used to form a diamond-like coating on a substrate, which is positioned in a vacuum chamber. A plasma is formed from the hydrocarbon gas precursor using an anode with an aperture, while the substrate acts as a cathode. A magnetic field is maintained in the chamber to direct the plasma toward the substrate and to deposit the diamond-like coating on the substrate. Such a process may be carried out at a temperature of less than 200° C., and/or at a temperature of less than 140° C. Other methods and materials that are known in the art may be used to form the adhesion material 130 in the gap 120.

In some embodiments, optional through holes 125 (shown in FIG. 4B in dashed lines) may be provided in one or both of the PDC element 100 and the substrate 110 for flowing material into the gap 120 to form the adhesion material 130. For example, if present, the number, spacing, size, shape, and position of the through holes 125 may be selected to improve flow of plasma into regions of the gap 120 that may be narrow or otherwise obstructed. After providing a flow path to the gap 120, the through holes 125 may be partially or fully filled with the adhesion material 130 during the deposition process used to filling the gap 120.

Optionally, to form the adhesion material 130 in the gap 120 and avoid forming the adhesion material 130 on other surfaces of the PDC element 100 and of the substrate 110, surfaces of the PDC element 100 and of the substrate 110 not facing the gap 120 may be masked. By way of example, surfaces where formation of the adhesion material 130 is not desired may be masked with an aluminum material, such as an aluminum foil, before the deposition process is performed. In this manner, deposition of the adhesion material 130 on the masked surfaces of the PDC element 100 and of the substrate 110 can be subsequently removed without removing the adhesion material 130 deposited in the gap 120 where no mask is provided.

The adhesion material 130 may substantially fill the gap 120 and bond the PDC element 100 and the substrate 110 together to form a PDC cutting element 150, as shown in FIG. 4C. The PDC cutting element 150 may include the substrate 110, the adhesion material 130 formed by a deposition process, as described herein, and the PDC element 100 bonded to the substrate 110 with the adhesion material 130.

Although the surfaces of the PDC element 100 and of the substrate 110 facing the gap 120 are shown in FIGS. 4A-4C as smooth, in some embodiments, such surfaces may be textured (e.g., etched, scratched, etc.) to provide increased surface area for improved adhesion.

The method of forming the PDC cutting element 150 shown in FIGS. 4A-4C and described above may have advantages over conventional methods of forming PDC cutting elements. By way of example and not limitation, attaching the PDC element 100 to the substrate 110 with the adhesion material 130 formed at a relatively low temperature (e.g., lower than the conventional HTHP methods and lower than the temperatures employed in brazing processes) may reduce stress (e.g., thermal stress) at an interface between the PDC element 100 and the substrate 110, which may reduce or eliminate delamination, early cutter failure, or other problems caused by such stress.

Furthermore, the PDC element 100 and the substrate 110 may be formed of materials that have conventionally not adhered well together. In other words, the compositions of the PDC element 100 and the substrate 110 may be designed independently of one another. For example, design parameters of the PDC element 100 may not be affected by the design parameters of the substrate 110, such as binder content in the substrate 110, because the adhesion material 130 may adhere to each of the PDC element 100 and the substrate 110 independently. For example, the PDC element 100 may be formed with a silicon catalyst instead of a cobalt catalyst while the substrate 110 may be formed with a matrix including cobalt. In addition, the PDC element 100 including a silicon catalyst may exhibit improved qualities (e.g., hardness) than a PDC element including a conventional cobalt catalyst because the silicon catalyst may react with carbon from the diamond to form silicon carbide, a material that may improve the qualities of the PDC element 100. The adhesion material 130, as described above, may form a bond between the PDC element 100 including the silicon catalyst and a substrate 110 including a cobalt matrix that may be stronger than bonds formed by conventional methods (e.g., brazing, pressing). Furthermore, the adhesion material 130 of the present disclosure may be used to attach the PDC element 100 to non-conventional substrates 110 (e.g., substrates made from materials other than conventional cobalt-cemented tungsten carbide).

Another possible advantage of the method of the present disclosure is the ability to attach a plurality of PDC elements 100 to a plurality of substrates 110 simultaneously as a batch in a common deposition process, thus saving time, effort, and cost. In other words, each PDC element 100 of a plurality of PDC elements 100 may be held adjacent to each substrate 110 of a plurality of substrates 110 and placed together in a deposition chamber. The deposition process may be performed on the plurality of PDC elements 100 and substrates 110 to form a plurality of PDC cutting elements 150. In some embodiments, a bit body (see FIG. 7) having a plurality of PDC elements 100 positioned adjacent to the bit body may be placed in a deposition chamber and processed, as described above, to attach the plurality of PDC elements 100 to the bit body.

Although particular embodiments of the present disclosure have been described with reference to FIGS. 4A-4C, other embodiments of PDC cutting elements, earth-boring tools, and portions thereof are shown by way of example in FIGS. 5-9.

Figure 5:
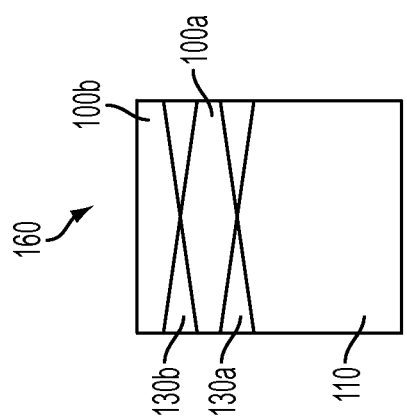
FIG. 5 is a side view of a PDC cutting element according to an embodiment of the present disclosure.

Referring to FIG. 5, a PDC cutting element 160 may include a substrate 110, a first adhesion material 130a over the substrate 110, a first PDC element 100a over the first adhesion material 130a, a second adhesion material 130b over the first PDC element 100a, and a second PDC element 100b over the second adhesion material 130b. Each of the first adhesion material 130a and the second adhesion material 130b may be formed as described above to attach the first PDC element 100a to the substrate 110 and the second PDC element 100b to the first PDC element 100a, respectively. Thus, the PDC cutting element 160 may include a plurality of PDC elements 100a, 100b, providing backup cutting capabilities and/or improved cutting abilities compared to PDC cutting elements including only one PDC element. Although FIG. 5 shows the PDC cutting element 160 including two PDC cutting elements 100a, 100b, the present disclosure includes PDC cutting elements 160 including more than two PDC elements 100.

Figure 6:
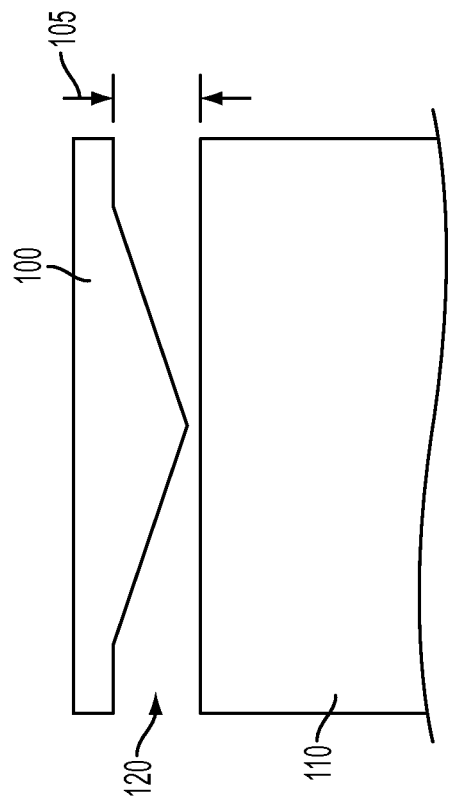
FIG. 6 is a side view showing details of a PDC element and a substrate to be attached to each other to form a PDC cutting element according to an embodiment of the present disclosure.

Referring to FIG. 6, details of another embodiment of the PDC element 100, the substrate 110, and the gap 120 are shown. The substrate 110 may be formed to include a surface facing the gap 120 that is substantially planar. The PDC element 100, on the other hand, may be formed to include a substantially planar cutting surface (i.e., the top surface when viewed in the perspective of FIG. 6) and a surface facing the gap 120 that is not substantially planar across the entire surface. For example, the surface of the PDC element 100 facing the gap 120 may have a central region that is tapered to cause the PDC element 100 to be thicker in the middle compared to an outside portion thereof. In other words, the distance 105 between the substrate 110 and the PDC element 100 may be lower in a central region of the gap 120 than in an outer region of the gap 120. In the outer region of the gap 120, the surface of the PDC element 100 may be substantially planar, as shown in FIG. 6. Thus, portions of the surface of the PDC element 100 facing the gap 120 may be substantially planar, while other portions of the surface of the PDC element facing the gap 120 may be non-planar (e.g., at least one of conical, curved, tapered, frustoconical, etc.). A portion (e.g., an outer portion) of the surface of the PDC element 100 facing the gap 120 may be parallel to the surface of the substrate 110 facing the gap 120, while another portion (e.g., a central portion) may be non-parallel to the surface of the substrate 110 facing the gap 120. In such an embodiment, the adhesion material 130 formed in the gap 120 may be encouraged to fill the gap 120 starting in a central region thereof and extending to an outer region thereof, reducing or eliminating voids in the adhesion material 130 and establishing a stronger bond. Furthermore, the substantially planar outer portion of the surface of the PDC element 100 facing the gap 120 may enable easier and more physically stable standoff placement to maintain a desired distance 105 between the PDC element 100 and the substrate 110.

Figure 7:
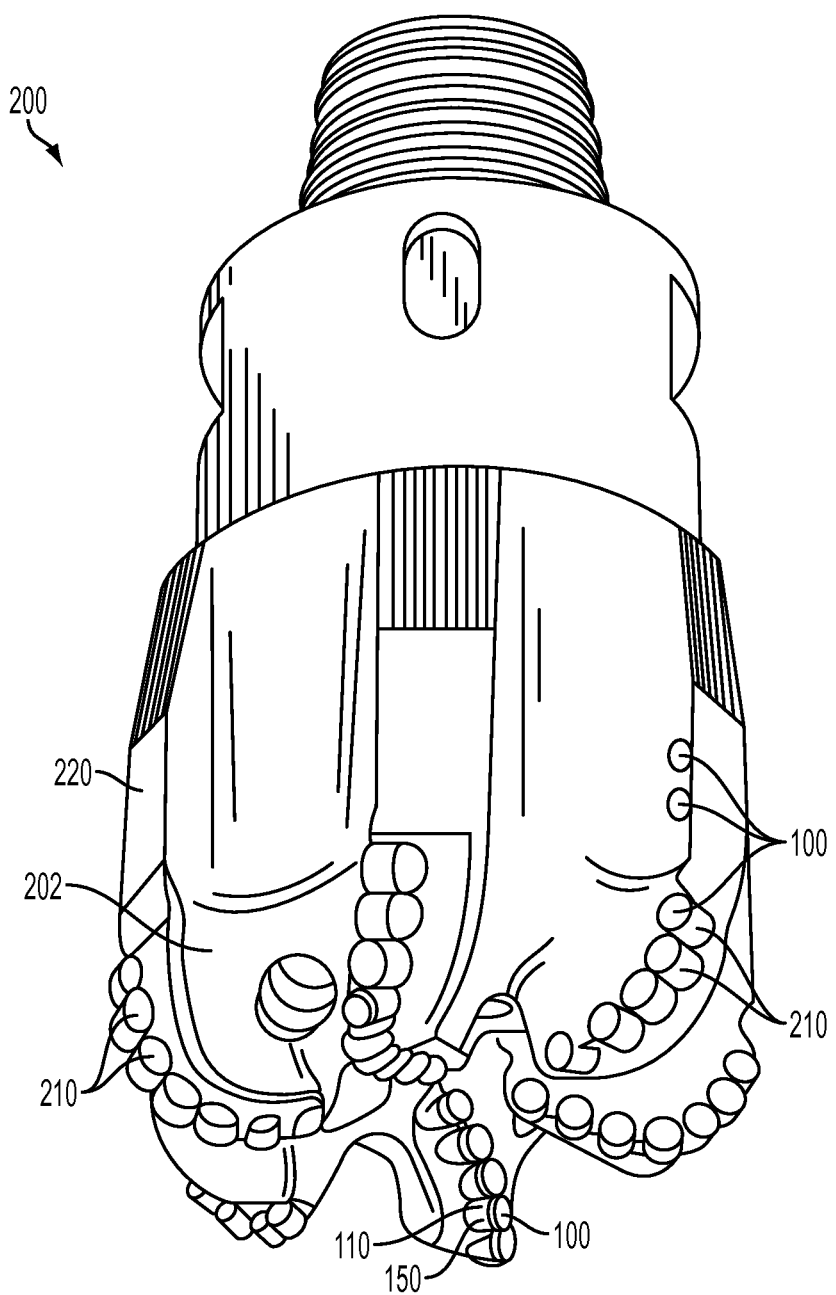
FIG. 7 is a perspective view of a drill bit formed according to an embodiment of the present disclosure.

Referring to FIG. 7, an embodiment of an earth-boring tool 200 of the present disclosure is shown. The earth-boring tool 200 may include a bit body 202 formed of materials and by methods known in the art. In some embodiments, for example, the bit body 202 may be formed by infiltrating a powdered carbide material with a molten matrix material. By way of another example, in some embodiments, the bit body 202 may be a pressed and sintered cemented tungsten carbide material, formed by pressing and sintering powdered tungsten carbide with a powdered matrix material including one or more of iron, cobalt, and nickel. Such pressed and sintered cemented tungsten carbide bit bodies are disclosed in U.S. patent application Ser. No. 11/272,439, filed Nov. 10, 2005, now U.S. Pat. No. 7,776,256, titled "EARTH-BORING ROTARY DRILL BITS AND METHODS OF MANUFACTURING EARTH-BORING ROTARY DRILL BITS HAVING PARTICLE-MATRIX COMPOSITE BIT BODIES," and U.S. patent application Ser. No. 11/271,153, filed Nov. 10, 2005, now U.S. Pat. No. 7,802,495, titled "METHODS OF FORMING EARTH-BORING ROTARY DRILL BITS," the disclosure of each of which is hereby incorporated by reference herein in its entirety. Regardless of the material used for the bit body 202, the earth-boring tool 200 may include one or more PDC cutting elements 150 (and/or PDC cutting elements 160, as described above (not shown in FIG. 7)) each including a PDC element 100 attached to a substrate 110 according to methods and structures disclosed herein.

Figure 8:
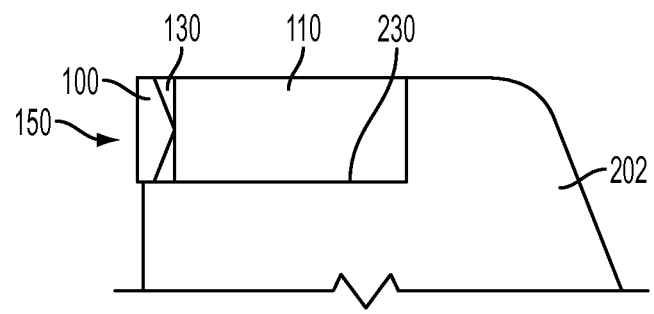
FIG. 8 is a side view of a portion of a bit body with a PDC cutting element attached thereto according to an embodiment of the present disclosure.

As shown in FIG. 8, in some embodiments, the one or more PDC cutting elements 150 may be attached to the bit body 202 by, for example, brazing, welding, pressing, sintering, infiltrating, or otherwise adhering the one or more PDC cutting elements 150 at least partially in a cutter pocket 230 formed in the bit body 202. In some embodiments, the PDC cutting elements 150 may be bonded to the bit body 202 in the cutter pockets 230 using a deposition process, as described herein. In such embodiments, the bit body 202 with cutting elements 150 positioned adjacent the cutter pockets 230 may be placed in a reactor and subjected to a deposition process, as described herein. Thus, adhesion material at least substantially similar to the adhesion material 130 that bonds the PDC element 100 to the substrate 110 may be deposited between the PDC cutting elements 150 and the cutter pockets 230 of the bit body 202.

Figure 9:
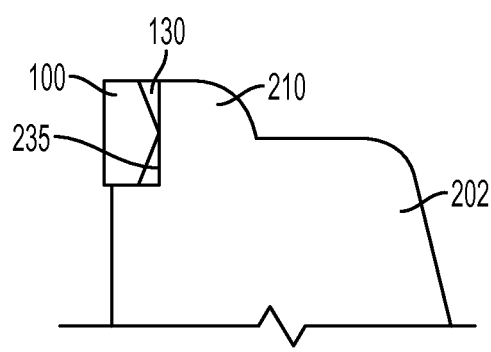
FIG. 9 is a side view of another portion of a bit body with a PDC element attached to the bit body without a separate substrate according to a method of the present disclosure.

In some embodiments, the substrate 110 may be omitted and the PDC element 100 may be bonded directly to a surface or portion of a bit body of an earth-boring tool 200 (e.g., a so-called "drag bit," a so-called "roller cone bit," a so-called "impregnated bit," etc.) using a deposition process, as described herein. In other words, a portion of the earth-boring tool 200 may act as a substrate to which the PDC element 100 may be bonded. For example, as shown in FIG. 9, the bit body 202 of the earth-boring tool 200 may be formed to have a surface 235 to which the PDC element 100 may be attached using the adhesion material 130 formed by a deposition process, as described in this disclosure. In other words, the PDC element 100 may be attached directly to the bit body 202 of the earth-boring tool 200 using embodiments of methods of the present disclosure, without first attaching the PDC element 100 to any other substrate 110 other than the bit body 202 of the earth-boring tool 200.

Referring again to FIG. 9 in conjunction with FIG. 7, in addition or alternatively, the bit body 202 may be formed to include one or more PDC cutting element supports 210. The PDC cutting element supports 210 may be formed integrally with the bit body 202. One or more PDC elements 100 may be attached to the one or more PDC cutting element supports 210 of the bit body 202 using methods disclosed herein. For example, the PDC elements 100 may be positioned adjacent to the PDC cutting element supports 210 of the bit body 202 and a deposition process, as described herein, may be performed to form the adhesion material 130 between the PDC elements 100 and the PDC cutting element supports 210. In other words, the PDC cutting element supports 210 may be substrates to which the PDC elements 100 are attached according to methods of the present disclosure. Thus, the earth-boring tool 200 may be formed having cutting surfaces (i.e., PDC elements 100) attached to the bit body 202 by the adhesion material 130 described above and without the need for brazing, pressing, infiltrating, or otherwise conventionally adhering the PDC elements 100 to the bit body 202. Such conventional methods of adhering PDC cutting elements to bit bodies may form regions of high stress, weakness, and/or premature failure at the interfaces between the PDC cutting elements and the bit bodies. Thus, methods of the present disclosure may be used to avoid such problems associated with previously known methods of bonding PDC cutting elements to bit bodies.

In addition or alternatively, the PDC elements 100 may be attached directly to the bit body 202 according to the methods disclosed herein in locations lacking a PDC cutting element support 210, such as at a leading edge of a gage region 220, as shown in FIG. 7. Such a configuration may enable the earth-boring tool 200 to have increased cutting abilities, better wear resistance, and/or improved backup cutting abilities as compared to conventional earth-boring tools. In other embodiments, the PDC elements 100 (without any cutting element support 210) may be attached directly to the bit body 202 at conventional locations, such as in cutting element pockets on rotationally leading ends of blades of the bit body 202.

Additional non-limiting example embodiments of the present disclosure are set forth below.

Embodiment 1

A method of attaching a polycrystalline diamond compact element to a substrate, the method comprising: positioning a polycrystalline diamond compact element adjacent a substrate; maintaining a gap between the polycrystalline diamond compact element and the substrate; and at least substantially filling the gap with an adhesion material using at least one of a chemical vapor deposition process, a plasma deposition process, a plasma-enhanced chemical vapor deposition process, a plasma arc deposition process, and a physical vapor deposition process.

Embodiment 2

The method of Embodiment 1, wherein the substrate comprises a particulate carbide material and a metal matrix material.

Embodiment 3

The method of any one of Embodiments 1 and 2, wherein at least substantially filling the gap comprises subjecting the polycrystalline diamond compact element and the substrate adjacent thereto to a chemical vapor deposition process.

Embodiment 4

The method of Embodiment 3, wherein subjecting the polycrystalline diamond compact element and the substrate adjacent thereto to a chemical vapor deposition process comprises subjecting the polycrystalline diamond compact element and the substrate adjacent thereto to a chemical vapor deposition process operating at a temperature of less than about 600° C.

Embodiment 5

The method of Embodiment 4, wherein subjecting the polycrystalline diamond compact element and the substrate adjacent thereto to a chemical vapor deposition process operating at a temperature of less than about 600° C. comprises placing the polycrystalline diamond compact and the substrate adjacent thereto in a plasma-enhanced chemical vapor deposition chamber and operating the plasma-enhanced chemical vapor deposition chamber with a maximum temperature of less than about 150° C.

Embodiment 6

The method of any one of Embodiments 1 through 5, wherein at least substantially filing the gap with an adhesion material comprises at least substantially filling the gap with at least one of a diamond material, a diamond-like carbon material, a cubic boron nitride material, a carbide material, and a nitride material.

Embodiment 7

The method of any one of Embodiments 1 through 6, further comprising masking surfaces of the polycrystalline diamond compact element and of the substrate outside the gap to reduce formation of the adhesion material on surfaces outside the gap.

Embodiment 8

The method of Embodiment 7, wherein masking surfaces comprises positioning an aluminum material over the surfaces.

Embodiment 9

The method of any one of Embodiments 1 through 8, wherein the substrate comprises at least one of a cemented carbide material and a portion of a bit body.

Embodiment 10

The method of any one of Embodiments 1 through 9, further comprising forming the polycrystalline diamond compact element to include a silicon catalyst.

Embodiment 11

The method of any one of Embodiments 1 through 10, wherein a distance between the polycrystalline diamond compact element and the substrate defining the gap is smaller in a central region of the gap than in an outer region of the gap.

Embodiment 12

The method of any one of embodiments 1 through 11, wherein positioning a polycrystalline diamond compact element adjacent a substrate comprises touching a surface or point of the substrate with a surface or point of the polycrystalline diamond compact element.

Embodiment 13

A method of forming a cutting element for an earth-boring tool, the method comprising: forming a polycrystalline diamond compact element by pressing diamond crystals together; forming a substrate comprising a particulate carbide material and a matrix material; positioning the polycrystalline diamond compact element adjacent the substrate leaving a gap between at least portions of the polycrystalline diamond compact element and the substrate; masking surfaces of the polycrystalline diamond compact element and surfaces of the substrate that do not face the gap; and forming an adhesion material on a surface of the polycrystalline diamond compact and on a surface of the substrate that face the gap to at least substantially fill the gap with the adhesion material.

Embodiment 14

The method of Embodiment 13, wherein forming an adhesion material comprises forming the adhesion material by at least one of growing and depositing the adhesion material with a low temperature deposition process.

Embodiment 15

The method of Embodiment 14, wherein forming the adhesion material by at least one of growing and depositing the adhesion material with a low temperature deposition process comprises forming the adhesion material by at least one of growing and depositing the adhesion material with a deposition process at a maximum temperature of less than about 600° C.

Embodiment 16

The method of any one of Embodiments 13 through 15, further comprising: forming another polycrystalline diamond compact element; positioning the another polycrystalline diamond compact element adjacent the polycrystalline diamond compact element; and forming another adhesion material between the another polycrystalline diamond compact element and the polycrystalline diamond compact element by at least one of growing and depositing the another adhesion material with a low temperature deposition process.

Embodiment 17

The method of any one of Embodiments 13 through 16, wherein forming an adhesion material comprises forming at least one of a diamond material, a diamond-like carbon material, a cubic boron nitride material, a carbide material, a nitride material, and a catalyst material selected to catalyze formation of inter-granular bonds in diamond material.

Embodiment 18

The method of any one of Embodiments 13 through 17, wherein forming an adhesion material comprises using a deposition process selected from the group consisting of a chemical vapor deposition process, a plasma deposition process, a plasma-enhanced chemical vapor deposition process, a plasma arc deposition process, and a physical vapor deposition process.

Embodiment 19

A cutting element for an earth-boring tool, the cutting element comprising: a polycrystalline diamond compact element attached to a substrate with an adhesion material, the adhesion material formed by a deposition process and comprising at least one of diamond, diamond-like carbon, a carbide material, a nitride material, and a cubic boron nitride material.

Embodiment 20

The cutting element of Embodiment 19, further comprising another polycrystalline diamond compact element and another adhesion material, the another polycrystalline diamond compact element attached to the polycrystalline diamond compact element with the another adhesion material

Embodiment 21

The cutting element of any one of Embodiments 19 and 20, wherein the polycrystalline diamond compact element comprises a silicon material in interstitial spaces between grains of diamond of the polycrystalline diamond compact element.

Embodiment 22

The cutting element of any one of Embodiments 19 through 21, wherein the polycrystalline diamond compact element is formed by forming inter-granular diamond bonds in the presence of a catalyst material and removing at least a portion of the catalyst material from interstitial spaces between grains of the polycrystalline diamond compact.

Embodiment 23

A method of forming an earth-boring tool, the method comprising: forming a bit body of an earth-boring tool; forming a polycrystalline diamond compact element; and attaching the polycrystalline diamond compact element to the bit body, the attaching comprising: positioning the polycrystalline diamond compact element adjacent an outer surface of the bit body such that a gap remains between at least portions of the polycrystalline diamond compact element and the outer surface of the bit body; and providing an adhesion material in the gap between the polycrystalline diamond compact element and the substrate by a deposition process.

Embodiment 24

A method of forming an earth-boring tool, the method comprising: forming a bit body of an earth-boring tool; forming a polycrystalline diamond compact element; forming a substrate configured to support the polycrystalline diamond compact element; attaching the polycrystalline diamond compact element to the substrate to form a cutting element, the attaching comprising: positioning the polycrystalline diamond compact element proximate the substrate such that a gap remains between at least portions of the polycrystalline diamond compact element and the substrate; and providing an adhesion material in the gap between the polycrystalline diamond compact element and the substrate by a deposition process; and attaching the cutting element to an outer surface of the bit body.

Embodiment 25

An earth-boring tool for drilling subterranean formations, the earth-boring tool comprising: a bit body; a polycrystalline diamond compact attached to the bit body; and an adhesion material comprising at least one of diamond, diamond-like carbon, a carbide material, a nitride material, and a cubic boron nitride material, the adhesion material disposed between and in contact with the polycrystalline diamond compact and the bit body.

While the present invention has been described herein with respect to certain embodiments, those skilled in the art will recognize and appreciate that it is not so limited. Rather, many additions, deletions, and modifications to the embodiments depicted and described herein may be made without departing from the scope of the invention as hereinafter claimed, and legal equivalents of the invention. In addition, features from one embodiment may be combined with features of another embodiment while still being encompassed within the scope of the invention as contemplated by the inventor. Furthermore, the invention has utility in conjunction with earth-boring drill bits having different bit profiles as well as different cutter types. For example, methods and structures of this disclosure may find use with any type of earth-boring tool, such as a drag bit, a roller cone bit, an impregnated bit, a hybrid bit, and a core bit.

What is claimed is:

1. A method of attaching a polycrystalline diamond compact element to a substrate, the method comprising:
    positioning a polycrystalline diamond compact element adjacent a substrate;
    maintaining a gap between the polycrystalline diamond compact element and the substrate; and
    at least substantially filling the gap with an adhesion material using at least one of a chemical vapor deposition process, a plasma deposition process, a plasma-enhanced chemical vapor deposition process, a plasma arc deposition process, and a physical vapor deposition process.

2. The method of claim 1, further comprising forming the substrate to include a particulate carbide material and a metal matrix material.

3. The method of claim 1, wherein at least substantially filling the gap comprises subjecting the polycrystalline diamond compact element and the substrate adjacent thereto to a chemical vapor deposition process.

4. The method of claim 3, wherein subjecting the polycrystalline diamond compact element and the substrate adjacent thereto to a chemical vapor deposition process comprises subjecting the polycrystalline diamond compact element and the substrate adjacent thereto to a chemical vapor deposition process operating at a temperature of less than about 600° C.

5. The method of claim 4, wherein subjecting the polycrystalline diamond compact element and the substrate adjacent thereto to a chemical vapor deposition process operating at a temperature of less than about 600° C. comprises placing the polycrystalline diamond compact and the substrate adjacent thereto in a plasma-enhanced chemical vapor deposition chamber and operating the plasma-enhanced chemical vapor deposition chamber with a maximum temperature of less than about 150° C.

6. The method of claim 1, wherein at least substantially filing the gap with an adhesion material comprises at least substantially filling the gap with at least one of a diamond material, a diamond-like carbon material, a cubic boron nitride material, a carbide material, and a nitride material.

7. The method of claim 1, further comprising masking surfaces of the polycrystalline diamond compact element and of the substrate outside the gap to reduce formation of the adhesion material on surfaces outside the gap.

8. The method of claim 7, wherein masking surfaces comprises positioning an aluminum material over the surfaces.

9. The method of claim 1, further comprising forming the substrate to include at least one of a cemented carbide material and a portion of a bit body.

10. The method of claim 1, further comprising forming the polycrystalline diamond compact element to include a silicon catalyst.

11. The method of claim 1, further comprising maintaining a distance between the polycrystalline diamond compact element and the substrate to be smaller in a central region of the gap than in an outer region of the gap.

12. The method of claim 1, wherein positioning a polycrystalline diamond compact element adjacent a substrate comprises touching a surface or point of the substrate with a surface or point of the polycrystalline diamond compact element.

13. The method of claim 1, wherein at least substantially filling the gap with an adhesion material comprises forming the adhesion material on a surface of the polycrystalline diamond compact facing the gap.

14. The method of claim 1, further comprising providing through holes in at least one of the polycrystalline diamond compact and the substrate and at least partially filling the through holes with the adhesion material.

15. A method of forming a cutting element for an earth-boring tool, the method comprising:
    forming a polycrystalline diamond compact element by sintering and bonding diamond crystals together;
    forming a substrate comprising a particulate carbide material and a matrix material;
    positioning the polycrystalline diamond compact element adjacent the substrate leaving a gap between at least portions of the polycrystalline diamond compact element and the substrate;
    masking surfaces of the polycrystalline diamond compact element and surfaces of the substrate that do not face the gap; and
    forming an adhesion material on a surface of the polycrystalline diamond compact and on a surface of the substrate that face the gap to at least substantially fill the gap with the adhesion material.

16. The method of claim 15, wherein forming an adhesion material comprises forming the adhesion material by at least one of growing and depositing the adhesion material with a low temperature deposition process.

17. The method of claim 16, wherein forming the adhesion material by at least one of growing and depositing the adhesion material with a low temperature deposition process comprises forming the adhesion material by at least one of growing and depositing the adhesion material with a deposition process at a maximum temperature of less than about 600° C.

18. The method of claim 15, further comprising:
   forming another polycrystalline diamond compact element;
   positioning the another polycrystalline diamond compact element adjacent the polycrystalline diamond compact element; and
   forming another adhesion material between the another polycrystalline diamond compact element and the polycrystalline diamond compact element by at least one of growing and depositing the another adhesion material with a low temperature deposition process.

19. The method of claim 15, wherein forming an adhesion material comprises forming at least one of a diamond material, a diamond-like carbon material, a cubic boron nitride material, a carbide material, a nitride material, and a catalyst material selected to catalyze formation of inter-granular bonds in diamond material.

20. The method of claim 15, wherein forming an adhesion material comprises using a deposition process selected from the group consisting of a chemical vapor deposition process, a plasma deposition process, a plasma-enhanced chemical vapor deposition process, a plasma arc deposition process, and a physical vapor deposition process.

* * * * *

UNITED STATES PATENT AND TRADEMARK OFFICE
CERTIFICATE OF CORRECTION

PATENT NO. : 9,145,603 B2  
APPLICATION NO. : 13/617604  
DATED : September 29, 2015  
INVENTOR(S) : Chaitanya K. Vempati and Suresh G. Patel Page 1 of 1

It is certified that error appears in the above-identified patent and that said Letters Patent is hereby corrected as shown below:

In the specification:

| | | |
|---|---|---|
| COLUMN 3, | LINE 12, | change "is framed on" to --is formed on-- |
| COLUMN 7, | LINE 49, | change "filed Feb. 11, 1999," to --filed Dec. 3, 2001,-- |
| COLUMN 7, | LINE 50, | change "titled" to --issued Oct. 5, 2004, titled-- |
| COLUMN 10, | LINE 34, | change "titled" to --issued Aug. 17, 2010, titled-- |
| COLUMN 10, | LINE 39, | change "titled" to --issued Sept. 28, 2010, titled-- |
| COLUMN 12, | LINE 43, | change "filing the gap" to --filling the gap-- |

In the claims:

CLAIM 6, COLUMN 16, LINE 9, change "filing the gap" to --filling the gap--

Signed and Sealed this  
Twenty-third Day of August, 2016

Michelle K. Lee  
*Director of the United States Patent and Trademark Office*